(12) United States Patent
Cheng et al.

(10) Patent No.: US 11,977,297 B2
(45) Date of Patent: May 7, 2024

(54) SPLICING TYPE LIGHT BOARD AND DISPLAY DEVICE

(71) Applicant: TCL CHINA STAR OPTOELECTRONICS TECHNOLOGY CO., LTD., Shenzhen (CN)

(72) Inventors: Xi Cheng, Shenzhen (CN); Gang Yu, Shenzhen (CN)

(*) Notice: Subject to any disclaimer, the term of this patent is extended or adjusted under 35 U.S.C. 154(b) by 398 days.

(21) Appl. No.: 17/414,344

(22) PCT Filed: Apr. 2, 2021

(86) PCT No.: PCT/CN2021/085214
§ 371 (c)(1),
(2) Date: Jun. 16, 2021

(87) PCT Pub. No.: WO2022/198716
PCT Pub. Date: Sep. 29, 2022

(65) Prior Publication Data
US 2023/0359083 A1    Nov. 9, 2023

(30) Foreign Application Priority Data

Mar. 22, 2021 (CN) .......................... 202110301408.2

(51) Int. Cl.
*G02F 1/1335* (2006.01)
*G02F 1/13357* (2006.01)

(52) U.S. Cl.
CPC .. *G02F 1/133612* (2021.01); *G02F 1/133603* (2013.01); *G02F 1/133608* (2013.01)

(58) Field of Classification Search
CPC ......... G02F 1/133612; G02F 1/133603; G02F 1/133608
See application file for complete search history.

(56) References Cited

U.S. PATENT DOCUMENTS

| | | | |
|---|---|---|---|
| 2020/0350476 A1* | 11/2020 | Lee ................... | G02B 27/0006 |
| 2020/0388636 A1* | 12/2020 | Yueh ................... | H01L 27/124 |
| 2021/0116749 A1* | 4/2021 | Kao ................... | G02F 1/133602 |
| 2021/0359081 A1* | 11/2021 | Kong ................... | H10K 59/18 |
| 2022/0045120 A1* | 2/2022 | Liu ................... | G09G 3/32 |
| 2022/0102476 A1* | 3/2022 | Kim ................... | H10K 59/1213 |

FOREIGN PATENT DOCUMENTS

| | | |
|---|---|---|
| CN | 203259745 U | 10/2013 |
| CN | 208077542 U | 11/2018 |
| CN | 109496068 A | 3/2019 |
| CN | 111999936 A | 11/2020 |
| CN | 112309268 A | 2/2021 |
| WO | 2020261409 A1 | 12/2020 |

* cited by examiner

Primary Examiner — Evan P Dzierzynski

(57) ABSTRACT

A splicing type light board and a display device are provided with a first LED light board and a second LED light board; a first end of the first LED light board near a first signal input terminal, and a second end away from the first signal input terminal; a first end of the second LED light board near a second signal input terminal, and a second end away from the second signal input terminal; and the first end of the first LED light board connecting the first end of the second LED light board or the second end of the first LED light board connecting the second end of the second LED light board.

15 Claims, 6 Drawing Sheets

SPLICING TYPE LIGHT BOARD AND DISPLAY DEVICE

FIELD OF INVENTION

The present disclosure relates to a display technical field, and specifically, to a splicing type light board and a display device.

BACKGROUND OF INVENTION

As the high-end TV market has higher and higher requirements for image quality, the improvement of the display image quality has become a new requirement for the high-end TVs. Current 8K organic light-emitting diodes (OLEDs) are limited by the problems, such as compensation circuits, backplate technology and driving designs, and need to be further developed. However, mini light emitted diodes (Mini LEDs), serving as a brand new display technology, have obvious advantages over the OLEDs in terms of brightness and power consumption.

However, because Mini LED backplates only support small-size devices, when used as a backlight for a large-size TV (75 inches, etc.), it is often required for multiple LED light boards to be spliced into large sizes. In addition, the splicing type large-size panel may have gaps of brightness that can be recognized by human eyes at the seams, resulting in obvious bright stripes on the display panel correspondingly, and seriously affecting the display quality of the display panel.

SUMMARY OF DISCLOSURE

Technical Problem

The present disclosure provides a splicing type light board and a display device, in order to solve a technical problem of gaps in brightness at splicing seams due to line losses of driving signals in a conventional splicing type light board.

Technical Solutions

The present disclosure provides a splicing type light board, comprising a first LED light board, on which a first signal input terminal is disposed, wherein the first LED light board has a first end near the first signal input terminal, and the first LED light board has a second end away from the first signal input terminal; and a second LED light board, on which a second signal input terminal is disposed, wherein the second LED light board has a first end near to the second signal input terminal, and the second LED light board has a second end away from the second signal input terminal; wherein the first end of the first LED light board connects the first end of the second LED light board, or the second end of the first LED light board connects the second end of the second LED light board.

Optionally, in some embodiments of the present disclosure, the first end of the first LED light board connects the first end of the second LED light board to form a first splicing seam; and the second end of the first LED light board and the second end of the second LED light board are away from the first splicing seam; and a distance between the first signal input terminal and the first splicing seam is less than a distance between the first signal input terminal and an end surface of the second end of the first LED light board, and a distance between the second signal input terminal and the first splicing seam is less than a distance between the second signal input terminal and an end surface of the second end of the second LED light board.

Optionally, in some embodiments of the present disclosure, the splicing type light board further comprises: a first flexible circuit board connecting the first signal input terminal; and a second flexible circuit board connecting the second signal input terminal; wherein a first splicing seam is defined between the first LED light board and the second LED light board, and the first flexible circuit board and the second flexible circuit board are folded along the first splicing seam to a back surface of the splicing type light board away from a light emitting surface of the splicing type light board.

Optionally, in some embodiments of the present disclosure, the first LED light board further includes a first substrate, a plurality of LED chips, and a first driving chip; the plurality of LED chips are disposed on the first substrate, the first driving chip electrically connects the first flexible circuit board; the first driving chip electrically connects the first signal input terminal through the first flexible circuit board, the first signal input terminal electrically connects the plurality of LED chips, and a driving signal generated by the first driving chip is loaded onto corresponding one of the LED chips through the first signal input terminal.

Optionally, in some embodiments of the present disclosure, the first signal input terminal and the second signal input terminal are disposed on a light emitting surface of the splicing type light board, the first driving chip and the second driving chip are power source driving chips, and the driving signal is a voltage signal.

Optionally, in some embodiments of the present disclosure, the first LED light board connects the second LED light board in a horizontal plane to form a first splicing seam, a plurality of LED chips in an array arrangement are disposed on each of the first LED light board and the second LED light board, a distance between two adjacent rows of the LED chips on the first LED light board is same as a distance between two adjacent rows of the LED chips on the second LED light board.

Optionally, in some embodiments of the present disclosure, the first LED light board connects the second LED light board in a horizontal plane to form a first splicing seam, a plurality of LED chips in an array arrangement are disposed on each of the first LED light board and the second LED light board, a distance between a row of the LED chips on the first LED light board adjacent to the first splicing seam and a row of the LED chips on the second LED light board adjacent to the first splicing seam is equal to a distance between two adjacent rows of the LED chips on the first LED light board and/or a distance between two adjacent rows of the LED chips on the second LED light board.

Optionally, in some embodiments of the present disclosure, the splicing type light board further comprises a third LED light board, wherein a third signal input terminal is disposed on the third LED light board, one end of the third LED light board near the third signal input terminal is a first end of the third LED light board, one end of the third LED light board away from the third signal input terminal is a second end of the third LED light board; and the second end of the third LED light board connects the second end of the first LED light board.

Optionally, in some embodiments of the present disclosure, the first LED light board connects the third LED light board in a horizontal plane to form a second splicing seam, a plurality of LED chips in an array arrangement are disposed on each of the first LED light board and the third LED light board, a distance between a row of the LED chips on the first LED light board adjacent to the second splicing seam and a row of the LED chips on the third LED light board adjacent to the second splicing seam is equal to a distance between two adjacent rows of the LED chips on the first LED light board and/or a distance between two adjacent rows of the LED chips on the third LED light board.

Optionally, in some embodiments of the present disclosure, the first signal input terminal is disposed on an end surface of the first end of the first LED light board or a back surface of the first LED light board away from a light emitting surface of the first LED light board; and/or the second signal input terminal is disposed on an end surface of the first end of the second LED light board or the back surface of the second LED light board away from the light emitting surface of the second LED light board.

The present disclosure further provides a display device, comprising a display panel and a backlight module, wherein the backlight module comprises aforementioned splicing type light board.

Optionally, in some embodiments of the present disclosure, the display device further comprises: a first flexible circuit board connecting the first signal input terminal; and a second flexible circuit board connecting the second signal input terminal; wherein a first splicing seam is between the first LED light board and the second LED light board, the first flexible circuit board and the second flexible circuit board are folded to a back surface of the splicing type light board away from a light emitting surface through the first splicing seam.

Optionally, in some embodiments of the present disclosure, the first LED light board further comprises a first substrate, a plurality of LED chips, and a first driving chip; the plurality of LED chips are disposed on the first substrate, the first driving chip electrically connects the first flexible circuit board; the first driving chip electrically connects the first signal input terminal through the first flexible circuit board, the first signal input terminal electrically connects the plurality of LED chips, and a driving signal generated by the first driving chip is loaded onto corresponding one of the LED chips through the first signal input terminal.

Optionally, in some embodiments of the present disclosure, the first LED light board connects the second LED light board in a horizontal plane to form a first splicing seam, a plurality of LED chips in an array arrangement are disposed on each of the first LED light board and the second LED light board, a distance between two adjacent rows of the LED chips on the first LED light board is same as a distance between two adjacent rows of the LED chips on the second LED light board.

Optionally, in some embodiments of the present disclosure, the first LED light board connects the second LED light board in a horizontal plane to form a first splicing seam, a plurality of LED chips in an array arrangement are disposed on each of the first LED light board and the second LED light board, a distance between a row of the LED chips on the first LED light board adjacent to the first splicing seam and a row of the LED chips on the second LED light board adjacent to the first splicing seam is equal to a distance between two adjacent rows of the LED chips on the first LED light board and/or a distance between two adjacent rows of the LED chips on the second LED light board.

Optionally, in some embodiments of the present disclosure, the display device further comprises a third LED light board, wherein a third signal input terminal is disposed on the third light board, one end of the third LED light board near the third signal input terminal is a first end of the third LED light board, one end of the third LED light board away from the third signal input terminal is a second end of the third LED light board; and the second end of the third LED light board connects the second end of the first LED light board.

Optionally, in some embodiments of the present disclosure, the first LED light board connects the third LED light board in a horizontal plane to form a second splicing seam, a plurality of LED chips in an array arrangement are disposed on each of the first LED light board and the third LED light board, a distance between a row of the LED chips on the first LED light board adjacent to the second splicing seam and a row of the LED chips on the third LED light board adjacent to the second splicing seam is equal to a distance between two adjacent rows of the LED chips on the first LED light board.

Optionally, in some embodiments of the present disclosure, the first LED light board connects the third LED light board in a horizontal plane to form a second splicing seam, wherein a plurality of LED chips in an array arrangement are disposed on each of the first LED light board and the third LED light board, a distance between a row of the LED chips on the first LED light board adjacent to the second splicing seam and a row of the LED chips on the third LED light board adjacent to the second splicing seam is equal to a distance between two adjacent rows of the LED chips on the third LED light board.

Optionally, in some embodiments of the present disclosure, the first signal input terminal is disposed on an end surface of the first end of the first LED light board or a back surface of the first LED light board away from a light emitting surface of the first LED light board.

Optionally, in some embodiments of the present disclosure, the second signal input terminal is disposed on an end surface of the first end of the second LED light board or the back surface of the second LED light board away from the light emitting surface of the second LED light board.

Beneficial Effect

In the splicing type light board, each LED light board includes a first end near a driving voltage input terminal and a second end away from the driving voltage input terminal. When the LED light board is lighted up, the driving voltage received by LED chips on the second end is significantly lower than the driving voltage received by the LED chips on the first end due to the line losses in the driving voltage transmission process. As a result, LED light gradually becomes dimmer in the direction from the first end to the second end on the LED light board. Therefore, the present disclosure proposes that the first end of the first LED light board which is provided with a first signal input terminal thereon connects the first end of the second LED light board which is provided with a second signal input terminal thereon, or the second end N1 of the first LED light board connects the second end N2 of the second LED light board. When the splicing type light board is lighted up, the brightest end of the first LED light board connects the brightest end of the second LED light board, or the dimmest end of the first LED light board 1 connects the dimmest end of the second LED light board 2 to avoid the gaps of brightness at the splicing seams of the splicing type light board, so as to prevent the display panel from bright stripes present at corresponding positions, so that the display quality of the display panel is significantly improved.

BRIEF DESCRIPTION OF DRAWINGS

In order to more clearly illustrate the technical solutions in the embodiment or in the present disclosure, the following drawings, which are intended to be used in the description of the embodiment or of the present disclosure, will be briefly described. Apparently, it is understood that the drawings described below are merely some embodiments of the present disclosure, and it will be possible to those skilled in the art to obtain other drawings according to these drawings without creative efforts.

DETAILED DESCRIPTION OF PREFERRED EMBODIMENTS

The technical solutions in embodiments of the present disclosure will be described clearly and completely in conjunction with the drawings in the embodiments of the present disclosure. Apparently, the described embodiments are only a part of the embodiments of the present disclosure, but not all of the embodiments. Based on the embodiments in the present disclosure, other embodiments obtained by those skilled in the art without creative work would fall within the protection scope of the present disclosure.

Various embodiments of the present disclosure provide a splicing type light board and a display device comprising the splicing type light board. The details are described below. It should be noted that the order of description in the following embodiments is not intended to limit the preferred order of the embodiments.

The present disclosure provides a splicing type light board, comprising a first LED light board and a second LED light board. The first LED light board is provided with a first signal input terminal thereon. The first LED light board has a first end near the first signal input terminal. The first LED light board has a second end away from the first signal input terminal. The second LED light board is provided with a second signal input terminal thereon. The second LED light board has a first end near the second signal input terminal. The second LED light board has a second end away from the second signal input terminal. The first end of the first LED light board connects the first end of the second LED light board or the second end of the first LED light board connects the second end of the second LED light board. In the present disclosure, by connecting the first end of the first LED light board near the first signal input terminal with the first end of the second LED light board near the second signal input terminal to ensure the connection between the brightest end of the first LED light board and the brightest end of the second LED light board when the splicing type light board is lighted up, so as to avoid the gaps of brightness at the splicing seams of the splicing type light board so that the display quality of the display panel is improved.

A first embodiment provided by the present disclosure is shown in FIG. 1 to FIG. 5, and provides a splicing type light board 100 comprising a first LED light board 1 and a second LED light board 2.

Figure 1:
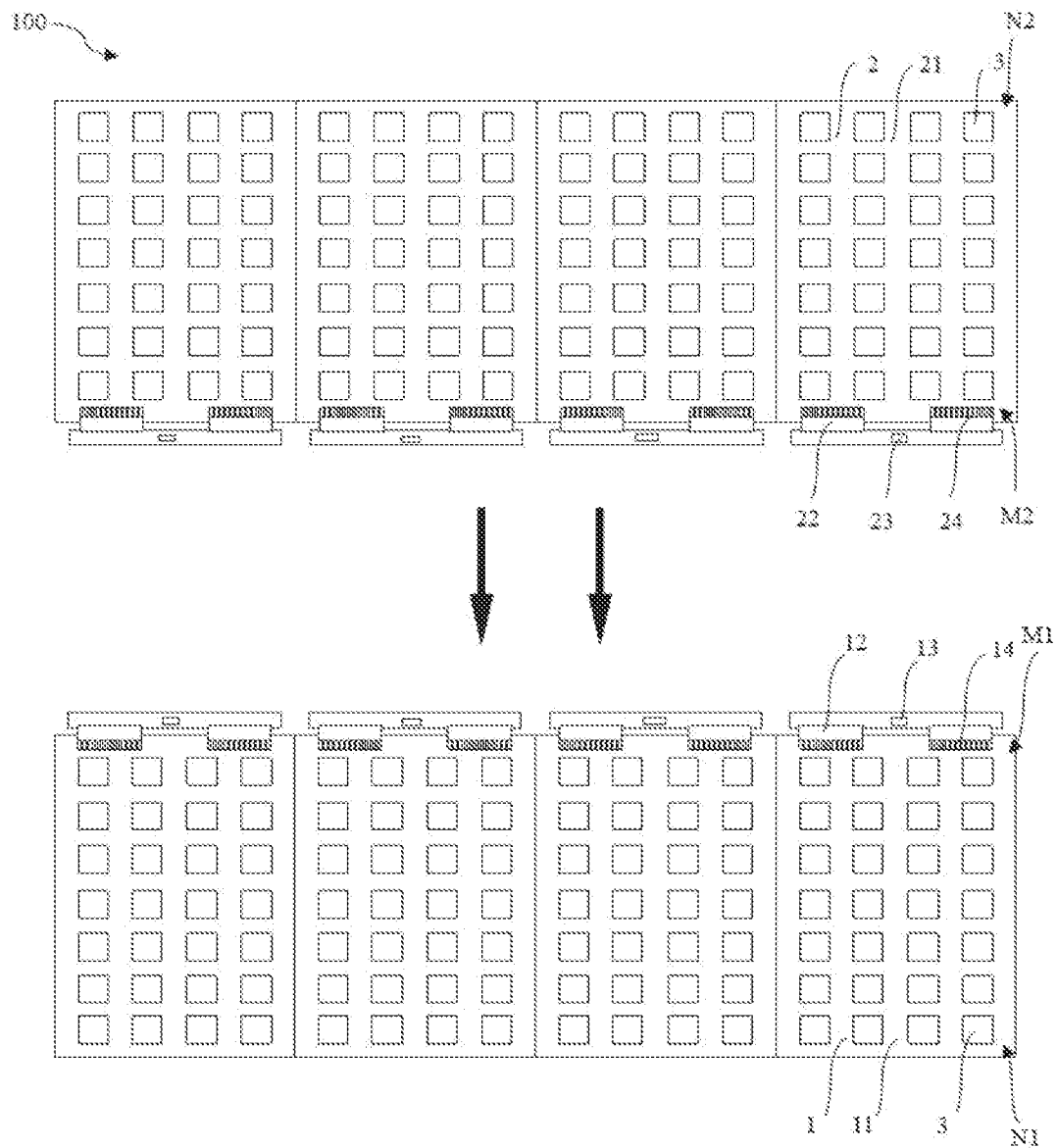
FIG. 1 is a schematic view of splicing a splicing type light board according to a first embodiment of the present disclosure.
Figure 2:
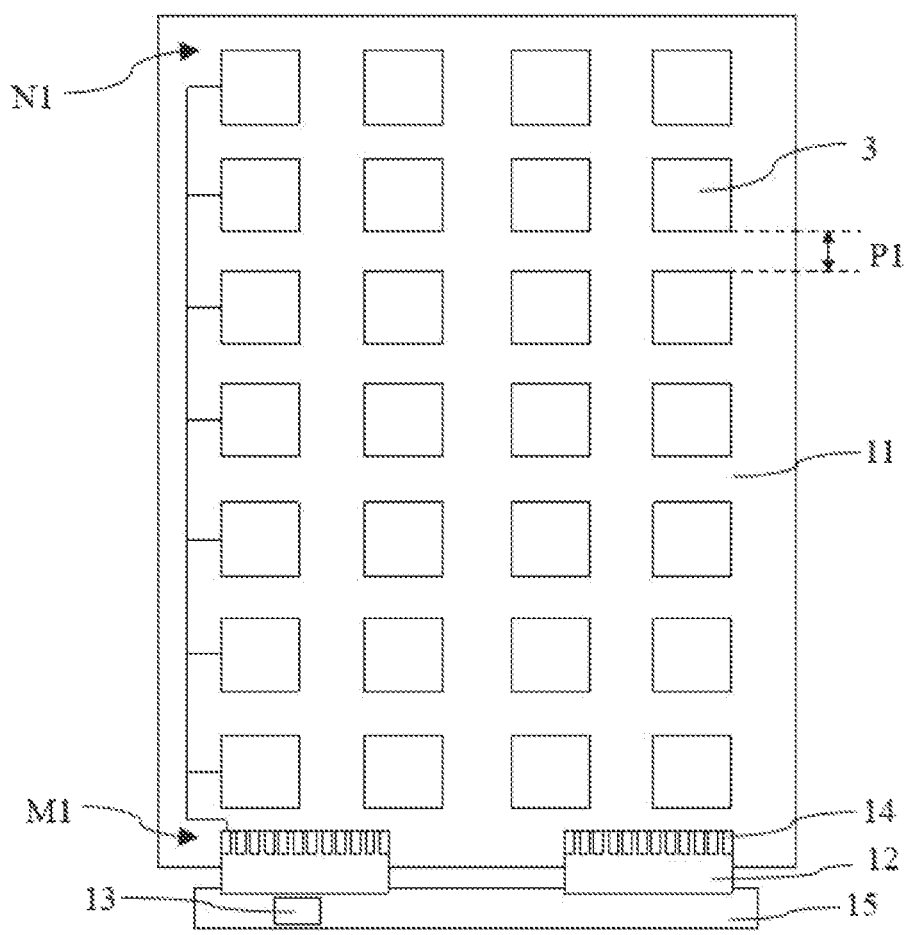
FIG. 2 is a structural schematic view of the first LED light board according to the embodiment in FIG. 1.

Referring to FIG. 2 together with FIG. 1, the first LED light board 1 comprises a first substrate 11, a plurality of LED chips 3, a first flexible circuit board 12, and a first driving chip 13.

A plurality of first signal input terminals 14 are disposed on an edge of the first substrate 11. The first signal input terminals 14 electrically connect the LED chips 3. When the first LED light board 1 is lighted up, the first signal input terminals 14 input a voltage driving signal toward the LED chips 3 to light up each of the LED chips 3 which connects one of the first signal input terminals 14.

The LED chips 3 are in an array arrangement on a surface of the first substrate 11. The LED chips 3 located in a same row electrically connect same one of the first signal input terminals 14. That is, a first signal input terminal 14 may light up the LED chips 3 in the same row. Since the voltage driving signal input by the first signal input terminals 14 causes line losses when the voltage driving signal is transmitted to the LED chips 3, and the farther the LED chips 3 away from the first signal input terminals 14 are, the greater the line losses of the voltage driving signal occurs to the LED chips 3, resulting in relatively dim light emitted from the LED chips 3 away from the first signal input terminals 14 after lighted up. Therefore, the LED chips 3 on the first LED light board 1 may have different brightness due to the different distances between the LED chips 3 and the first signal input terminals 14.

One side of the first flexible circuit board 12 electrically connects the first signal input terminals 14. The first driving chip 13 is disposed on another side of the first flexible circuit board 12.

The first driving chip 13 is disposed on an external circuit board 15. The first driving chip 13 electrically connects the first signal input terminals 14 through the first flexible circuit board 12. The voltage driving signal generated by the first driving chip 13 sequentially passes the first flexible circuit board 12 and the first signal input terminals 14 to load onto corresponding one of the LED chips 3. The first driving chip 13 may be a power source driving chip.

One end of the first LED light board 1 near the first signal input terminals 14 is a first end M1 of the first LED light board. One end of the first LED light board 1 away from the first signal input terminals 14 is a second end N1 of the first LED light board. That is, a distance between the first signal input terminals 14 and an end surface of the first end M1 of the first LED light board is less than a distance between the first signal input terminals 14 and an end surface of the second end N1 of the first LED light board. When the first LED light board 1 is lighted up, along a direction from the first signal input terminals 14 to the second end N1 of the first LED light board, the LED chips 3 gradually turn dim from bright. In this embodiment, the first substrate 11 has a rectangular structure. The first end M1 of the first LED light board and the second end N1 of the first LED light board are located at opposite ends of the first substrate 11. The first signal input terminals 14 are disposed on the first end M1 of the first LED light board. Therefore, the LED chips 3 on the first end M1 of the first LED light board are brightest, and the LED chips 3 on the second end N1 of the first LED light board are dimmest.

In this embodiment, the second LED light board 2 and the first LED light board 1 have same structure. Specifically, the second LED light board 2 comprises a second substrate 21, a plurality of LED chips 3, a second flexible circuit board 22, and a second driving chip 23.

A plurality of second signal input terminals 24n are disposed on an edge of the second substrate 21. The second signal input terminal 24 electrically connects the LED chips 3. When the second LED light board 2 is lighted up, the second signal input terminals 24 input a voltage driving signal toward the LED chips 3 to light up each of the LED chips 3 which connects the second signal input terminals 24.

The LED chips 3 are in an array arrangement on a surface of the second substrate 21. The LED chips 3 located in a same row electrically connect same one of the second signal input terminals 24. That is, a second signal input terminal 14 may light up the LED chips 3 in the same row. Since the voltage driving signal input by the second signal input terminals 24 also causes line losses when the voltage driving signal is transmitted to the LED chips 3, the LED chips 3 on the second LED light board 2 may have different brightness due to the different distances between the LED chips 3 and the second signal input terminals 24.

One side of the second flexible circuit board 22 electrically connects the second signal input terminals 24. The second driving chip 23 is disposed on another side of the second flexible circuit board 22.

The second driving chip 23 electrically connects the second signal input terminals 24 through the second flexible circuit board 22. The voltage driving signal generated by the second driving chip 23 sequentially passes the second flexible circuit board 22 and the second signal input terminals 24 to load onto corresponding one of the LED chips 3. The second driving chip 23 may be a power source driving chip.

One end of the second LED light board 2 near the second signal input terminals 24 is a first end M2 of the second LED light board. One end of the second LED light board 2 away from the second signal input terminals 24 is a second end N2 of the second LED light board. That is, a distance between the second signal input terminals 24 and an end surface of the first end M2 of the second LED light board is less than a distance between the second signal input terminals 24 and an end surface of the second end N2 of the second LED light board. When the second LED light board 2 is lighted up, along a direction from the second signal input terminals 24 to the second end N2 of the second LED light board, the LED chips 3 gradually turn dim from bright. In this embodiment, the second substrate 21 has a rectangular structure. The first end M2 of the second LED light board and the second end N2 of the second LED light board are located at opposite ends of the second substrate 21. The second signal input terminals 24 are disposed on the first end M2 of the second LED light board. Therefore, the LED chips 3 on the first end M2 of the second LED light board are brightest, and the LED chips 3 on the second end N2 of the second LED light board are dimmest.

When the first LED light board 1 connects the second LED light board 2 to obtain the splicing type light board 100, the first end M1 of the first LED light board connects the first end M2 of the second LED light board in order to avoid the jump of brightness generated at the connecting seam.

Figure 3:
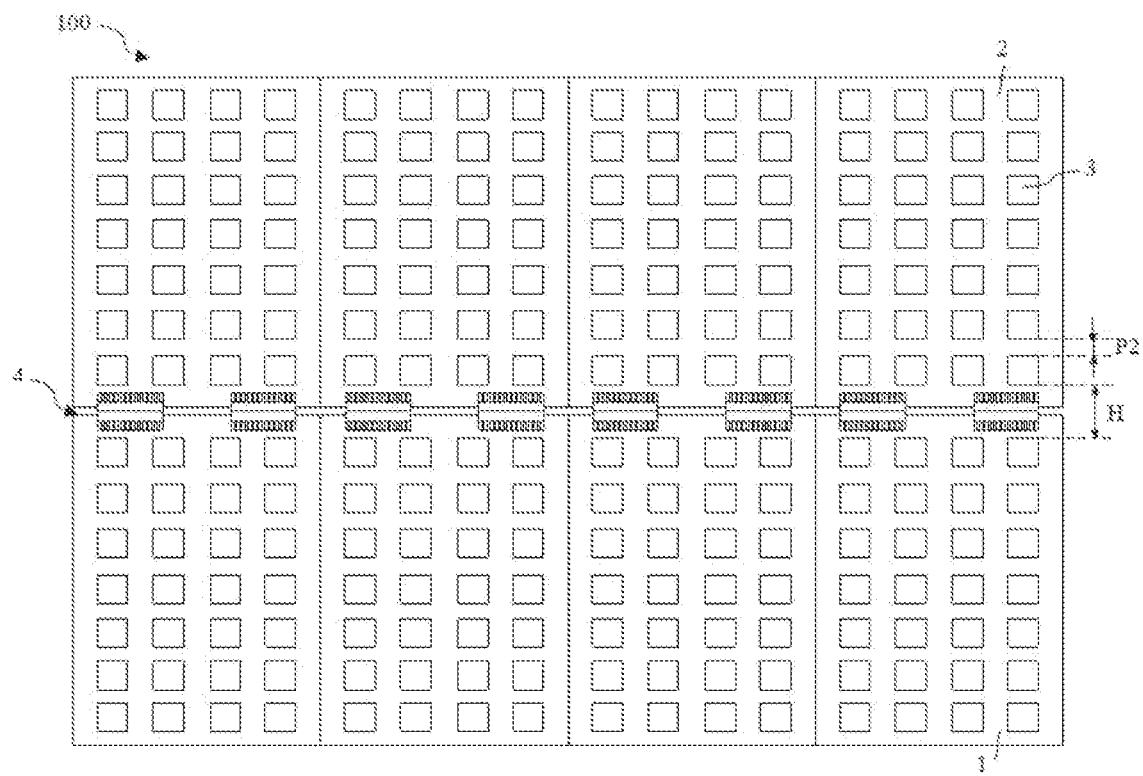
FIG. 3 is a top view of a light emitting surface of the splicing type light board in FIG. 2 after splicing.

Referring to FIG. 3, the connection of the first end M1 of the first LED light board and the first send M2 of the second LED light board forms a first splicing seam 4. The first end M1 of the first LED light board is close to the first splicing seam 4. The second end N1 of the first LED light board is away from the first splicing seam 4. The first end M2 of the second LED light board is close to the first splicing seam 4. The second end N2 of the second LED light board is away from the first splicing seam 4. A distance between each of the first signal input terminals 14 and the first splicing seam 4 is less than a distance between the first signal input terminal 14 and an end surface of the second end N1 of the first LED light board. A distance between each of the second signal input terminals 24 and the first splicing seam 4 is less than a distance between each of the second signal input terminals 24 and an end surface the second end N2 of the second LED light board.

In this embodiment, by connecting the brightest end of the first LED light board and the brightest end of the second LED light board to avoid the gap of brightness at the first splicing seam 4 of the splicing type light board 100, so as to prevent the first splicing seam 4 of the splicing type light board 100 from bright stripes present at corresponding positions so that the display quality of the display panel is improved.

In other specific embodiments of the present disclosure, the second end N1 of the first LED light board may connect the second end N2 of the second LED light board. By connecting the dimmest end of the first LED light board 1 and the dimmest end of the second LED light board 2, the gap of brightness may be avoided at the first splicing seam 4 of the splicing type light board 100 so as to prevent the display panel from bright stripes present at corresponding positions, so that the display quality of the display panel is improved.

Figure 4:
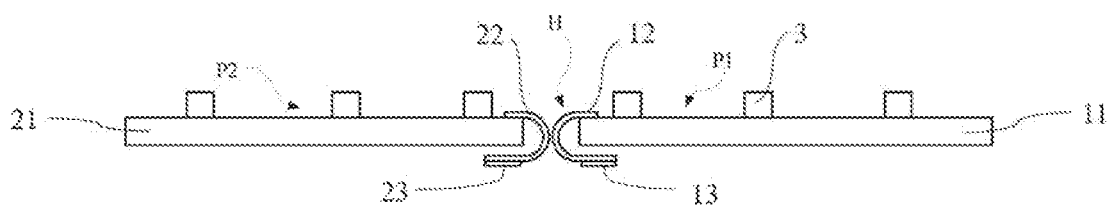
FIG. 4 a side view of the splicing type light board in FIG. 2 after splicing.
Figure 5:
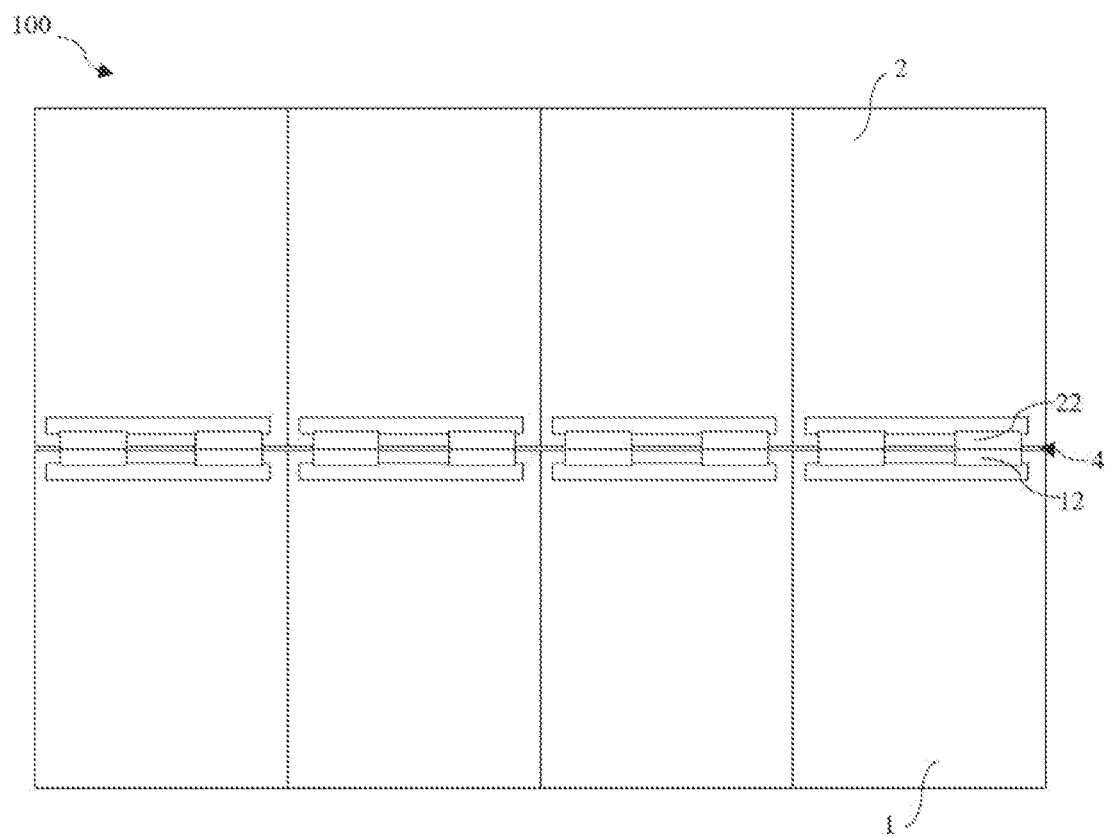
FIG. 5 is a top view of a back surface of the splicing type light board in FIG. 2 after splicing.

Referring to FIG. 4 in combination with FIG. 5, in order to reduce the size of the first splicing seam 4, the first signal input terminals 14 and the second signal input terminals 24 are disposed on two sides of the first splicing seam 4, and the first flexible circuit board 12 and the second flexible circuit board 22 are folded to a back surface of the splicing type light board 100 away from a light emitting surface of the splicing type light board 100 by the first splicing seam 4. The first flexible circuit board 12 and the first driving chip 13 on the first flexible circuit board 12 are folded to a back surface of the first substrate 11. The second flexible circuit board 22 and the second driving chip 23 of the second flexible circuit board 22 are folded to a back surface of the second substrate 21.

The connection of the first LED light board 1 and the second LED light board 2 forms the first splicing seam 4 in a horizontal plane. A distance between adjacent two rows of the LED chips 3 on the first LED light board 1 is P1. A distance between adjacent two rows of the LED chips 3 on the second LED light board 2 is P2. P1 should be equal to P2 for improving the uniformity of the entire brightness of the splicing type light board 100.

In this embodiment, the extension direction the row of the LED chips 3 is same as the extension direction of the first splicing seam 4. A distance between a row of the LED chips 3 on the first LED light board 1 adjacent to the first splicing seam 4 and a row of the LED chips 3 on the second LED light board 2 adjacent to the first splicing seam 4 is H. H should be equal to P1 and/or P2 for further improving the uniformity of the brightness at the first splicing seam 4 of the splicing type light board 100. That is, the distance H between a row of the LED chips 3 on the first LED light board 1 adjacent to the first splicing seam 4 and a row of the LED chips 3 on the second LED light board 2 adjacent to the first splicing seam 4 is equal to a distance between adjacent two rows of the LED chips 3 on the first LED light board 1 and/or a distance between adjacent two rows of the LED chips 3 on the second LED light board 2.

Figure 6:
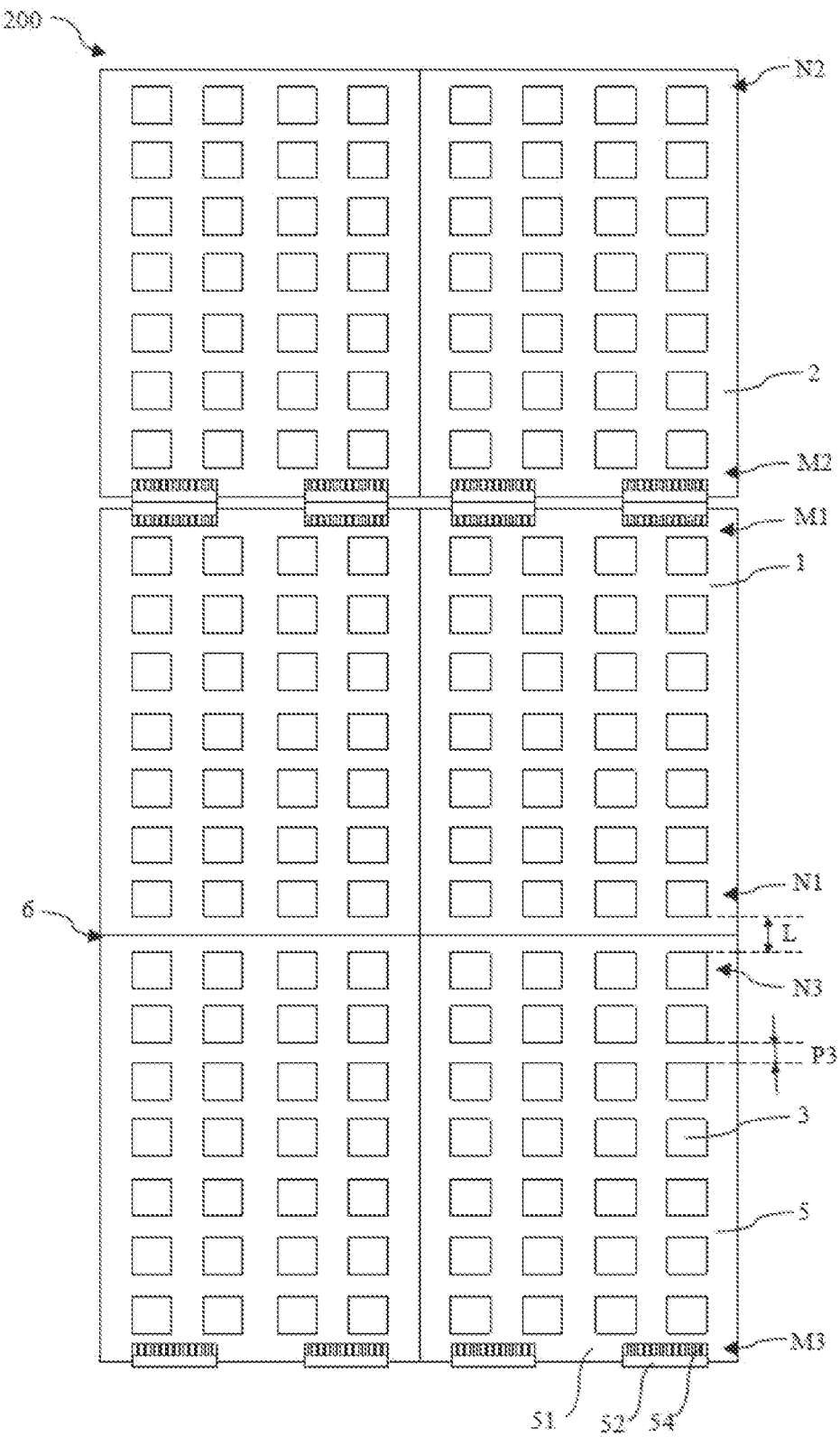
FIG. 6 is a structural schematic view of a splicing type light board according to a second embodiment of the present disclosure.

A second embodiment provided by the present disclosure is shown in FIG. 6, and the difference between a second splicing type light board 200 of this embodiment and the first splicing type light board of the first embodiment is that: the second splicing type light board 200 further comprises a third LED light board 5. The third LED light board 5 has same structure as the first LED light board 1. Specifically, the third LED light board 5 comprises a third substrate 51, a plurality of LED chips 3, a third flexible circuit board 52, and a third driving chip (not shown). The third substrate 51 is provided with a third signal input terminals 54 thereon. One end of the third LED light board 5 near the third signal input terminals 54 is a first end M3 of the third LED light board. One end of the third LED light board 5 away from the third signal input terminals 54 is a second end N3 of the third LED light board.

In this embodiment, the second end N3 of the third LED light board connects the second end N1 of the first LED light board, so that the dimmest end of the third LED light board connects the dimmest end of the first LED light board to avoid the gap of brightness generated at the connecting position to prevent the display panel from bright stripes present at the corresponding position.

The first LED light board 1 connects the third LED light board 5 in a horizontal plane to form a second splicing seam 6. A distance between adjacent two rows of the LED chips 3 on the third LED light board 5 is P3. P3 should be equal to P1 and P2 for increasing the uniformity of the entire brightness of the splicing type light board 100.

The extension direction the row of the LED chips 3 is same as the extension direction of the second splicing seam 6. A distance between a row of the LED chips 3 on the first LED light board 1 adjacent to the second splicing seam 6 and a row of the LED chips 3 on the third LED light board 5 adjacent to the second splicing seam 6 is L. L should be equal to P1 and/or P3 for further increasing the uniformity of the brightness at the second splicing seam 6 of the splicing type light board 200. That is, the distance L between a row of the LED chips 3 on the first LED light board 1 adjacent to the second splicing seam 6 and a row of the LED chips 3 on the third LED light board 5 adjacent to the second splicing seam 6 is equal to a distance between adjacent two rows of the LED chips 3 on the first LED light board 1 and/or a distance between adjacent two rows of the LED chips 3 on the third LED light board 5.

In another embodiment of the present disclosure, the second end N1 of the first LED light board connects the second end N2 of the second LED light board. The dimmest end of the first LED light board 1 connects the dimmest end of the second LED light board 2. The first end M3 of the third LED light board connects the first end M1 of the first LED light board, so that the brightest end of the third LED light board connects the brightest end of the first LED light board to avoid the gap of brightness generated at the connecting position to prevent the display panel from bright fringes presented at the corresponding position.

Figure 7:
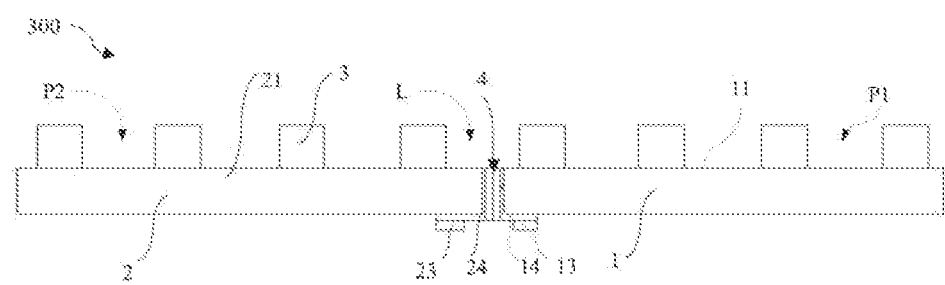
FIG. 7 is a side view of the splicing type light board after splicing according to a third embodiment of the present disclosure.

A third embodiment provided by the present disclosure is shown in FIG. 7. The difference between a third splicing type light board 300 of this embodiment and the first embodiment is that the first signal input terminals 14 are disposed on an end surface and/or a back surface of the first substrate 11. The back surface of the first substrate 11 is a surface away from the light emitting surface of the first substrate 11. The second signal input terminals 24 are disposed on an end surface and/or a back surface of the second substrate 21. The back surface of the second substrate 21 is a surface away from the light emitting surface of the second substrate 21. The first driving chip 13 may be disposed on the back surface of the first substrate 11. The second driving chip 23 may be disposed on the back surface of the second substrate 21.

Specifically, the signal input terminal disposed on a side surface of the substrate may form a conductive terminal electrically connected with an in-plane routing on the side surface of the substrate. Next, the conductive terminal is covered by an insulation protective film 7 to avoid short circuit and electrostatic breakdown when connecting.

Specifically, disposing the signal input terminal on the back surface of the substrate includes forming a conductive terminal electrically connected with the in-plane routing on the back surface of the substrate. The conductive terminal may electrically connect the in-plane routing through the conductive line on the side surface of the substrate, and may also electrically connect the in-plane routing through vias on the substrate. There is no specific restrictions here. When the conductive line is disposed on the side surface of the substrate, the conductive line should be covered by the insulation protective film 7 to avoid short circuits and electrostatic breakdown during connecting.

In this embodiment, by arranging the signal input terminal on the side surface and/or the back surface of the substrate, the size of the splicing seam 4 can be further reduced, and the seamless splicing of the splicing type light board can be realized.

One embodiment of the present disclosure further provides a display device, and the display device includes a liquid crystal display panel and a backlight module. The backlight module may include the splicing type light board described in any of the foregoing embodiments. For the specific structure of the splicing type light board, refer to the foregoing embodiments, which are not repeated here.

It can be understood that one of the LED chips in the present disclosure may be a Mini LED chip, it can also be a Micro LED chip, which is not specifically limited here.

It can be understood that the number of the LED light boards can be two or more in the splicing type light board of the present disclosure, and the specific number is not limited by the embodiment of the present disclosure.

It can be understood that sizes of various LED light boards in the present disclosure may be different or same. The embodiments of the present disclosure are described by the LED light boards with same sizes, but they are not limited thereto.

It can be understood that the number of the LED chips on each of the LED light boards in the drawing of the present disclosure is only for illustration to facilitate the description of the embodiments of the present disclosure, but it cannot be understood as a limitation on the present disclosure.

It can be understood that, in other specific embodiments of the present disclosure, the driving chip can be disposed on the substrate of the LED light board or on the external circuit board connected to the flexible circuit board. There is no specific limitation here.

It can be understood that, in order to adapt to different application scenarios, the first LED light board 1 and the second LED light board 2 may not be in the same horizontal plane, which is not specifically limited here. That is, the included angle between the plane where the first LED light board 1 is located and the plane where the second LED light board 2 is located is less than 180 degrees. In order to ensure that the brightness of the LED chips 3 on the splicing type light board 100 changes uniformly, the distance between the adjacent two rows of the LED chips 3 on the first LED light board 1 and/or the adjacent two rows of the LED chips on the second LED light board 2 can be adjusted correspondingly.

In one embodiment of the present disclosure, the first substrate 11, the second substrate 21, and the third substrate 51 are rectangular. It can be understood that, in other specific embodiments of the present disclosure, one or more of the first substrate 11, the second substrate 21, and the third substrate 51 may also be other heterogeneous structures, which are not specifically limited herein.

In one specific embodiment of the present disclosure, by connecting the first end of the first LED light board 1 which is provided with the first signal input terminals 14 thereon with the first end of the second LED light board 2 which is provided with the second signal input terminals 24 thereon, or by connecting the second end of the first LED light board away from the first signal input terminals 14 with the second end of the second LED light board away from the second signal input terminals, when the splicing type light board is lighted up, the brightest end of the first LED light board 1 connects the brightest end of the second LED light board 2, or the dimmest end of the first LED light board 1 connects the dimmest end of the second LED light board 2 to avoid the gaps of brightness generated at the splicing seams of the splicing type light board to prevent the display panel from bright stripes present at the corresponding position, and significantly improve the display quality of the display panel.

The present disclosure adapts to the design requirements of large-size display panels by adding a third LED light board. By connecting the dimmest end of the third LED light board with the dimmest end of the first LED light board, or by connecting the brightest end of the third LED light board with the brightest end of the first LED light board, the gap of brightness may be avoided at the second splicing seam 6 so as to prevent the display panel from bright fringes presented at the second splicing seam 6.

A splicing type light board and a display device provided in the embodiments of the present disclosure are described in detail above. Specific examples are used for explaining the principles and implementation of the present disclosure. The descriptions of the above embodiments are only for helping one to understand the method of this disclosure and its core concept. Furthermore, for those skilled in the art, there will be modifications in the specific implementation and application scope according to the concept of this disclosure. In summary, the content of this description should not be understood as a limitation of this disclosure.

What is claimed is:

1. A splicing type light board, comprising
a first LED light board, on which a first signal input terminal is disposed, wherein the first LED light board has a first end near the first signal input terminal, and the first LED light board has a second end away from the first signal input terminal,
the first LED light board further includes a first flexible circuit board, a first substrate, a plurality of first LED chips, and a first driving chip,
the plurality of first LED chips are disposed on the first substrate,
the first flexible circuit board is electrically connected to the first signal input terminal and the first driving chip, the first driving chip is electrically connected to the first signal input terminal through the first flexible circuit board, and a first driving signal generated by the first driving chip is loaded onto one or more of the first LED chips through the first signal input terminal;
a second LED light board, on which a second signal input terminal is disposed, wherein the second LED light board has a first end near to the second signal input terminal, and the second LED light board has a second end away from the second signal input terminal,
the second LED light board further includes a second flexible circuit board, a second substrate, a plurality of second LED chips, and a second driving chip,
the plurality of second LED chips are disposed on the second substrate,
the second flexible circuit board is electrically connected to the second signal input terminal and the second driving chip, the second driving chip is electrically connected to the second signal input terminal through the second flexible circuit board, and a second driving signal generated by the second driving chip is loaded onto one or more of the second LED chips through the second signal input terminal; and
a third LED light board, on which a third signal input terminal is disposed, wherein the third LED light board has a first end near the third signal input terminal, and the third LED light board has a second end away from the third signal input terminal,
the third LED light board further includes a third flexible circuit board, a third substrate, a plurality of third LED chips, and a third driving chip,
the plurality of third LED chips are disposed on the third substrate,
the third flexible circuit board is electrically connected to the third signal input terminal and the third driving chip, the third driving chip is electrically connected to the third signal input terminal through the third flexible circuit board, and a third driving signal generated by the third driving chip is loaded onto one or more of the third LED chips through the third signal input terminal;
wherein the first end of the first LED light board connects the first end of the second LED light board, and the second end of the first LED light board connects the second end of the third LED light board,
the first driving chip, the second driving chip, and the third driving chip are power source driving chips, and
the first driving signal, the second driving signal, and the third driving signal are voltage signals.

2. The splicing type light board according to claim 1, wherein the first end of the first LED light board connects the first end of the second LED light board to form a first splicing seam; and the second end of the first LED light board and the second end of the second LED light board are away from the first splicing seam; and
wherein a distance between the first signal input terminal and the first splicing seam is less than a distance between the first signal input terminal and an end surface of the second end of the first LED light board, and a distance between the second signal input terminal and the first splicing seam is less than a distance between the second signal input terminal and an end surface of the second end of the second LED light board.

3. The splicing type light board according to claim 1:
wherein a first splicing seam is defined between the first LED light board and the second LED light board, and the first flexible circuit board and the second flexible circuit board are folded along the first splicing seam to a back surface of the splicing type light board away from a light emitting surface of the splicing type light board.

4. The splicing type light board according to claim 1, wherein the first LED light board connects the second LED light board in a horizontal plane to form a first splicing seam, a plurality of LED chips in an array arrangement are disposed on each of the first LED light board and the second LED light board, a distance between two adjacent rows of the LED chips on the first LED light board is same as a distance between two adjacent rows of the LED chips on the second LED light board.

5. The splicing type light board according to claim 1, wherein the first LED light board connects the second LED light board in a horizontal plane to form a first splicing seam, a plurality of LED chips in an array arrangement are disposed on each of the first LED light board and the second LED light board, a distance between a row of the LED chips on the first LED light board adjacent to the first splicing seam and a row of the LED chips on the second LED light board adjacent to the first splicing seam is equal to a distance between two adjacent rows of the LED chips on the first LED light board and/or a distance between two adjacent rows of the LED chips on the second LED light board.

6. The splicing type light board according to claim 1, wherein the first LED light board connects the third LED light board in a horizontal plane to form a second splicing seam, a plurality of LED chips in an array arrangement are disposed on each of the first LED light board and the third LED light board, a distance between a row of the LED chips on the first LED light board adjacent to the second splicing seam and a row of the LED chips on the third LED light board adjacent to the second splicing seam is equal to a distance between two adjacent rows of the LED chips on the first LED light board and/or a distance between two adjacent rows of the LED chips on the third LED light board.

7. The splicing type light board according to claim 1, wherein the first signal input terminal is disposed on an end surface of the first end of the first LED light board or a back surface of the first LED light board away from a light emitting surface of the first LED light board;
and/or
the second signal input terminal is disposed on an end surface of the first end of the second LED light board or the back surface of the second LED light board away from the light emitting surface of the second LED light board.

8. A display device, comprising: a display panel and a backlight module, wherein the backlight module comprises a splicing type light board comprising:
a first LED light board, on which a first signal input terminal is disposed, wherein the first LED light board has a first end near the first signal input terminal, and the first LED light board has a second end away from the first signal input terminal,
the first LED light board further includes a first flexible circuit board, a first substrate, a plurality of first LED chips, and a first driving chip,
the plurality of first LED chips are disposed on the first substrate,
the first flexible circuit board is electrically connected to the first signal input terminal and the first driving chip, the first driving chip is electrically connected to the first signal input terminal through the first flexible circuit board, and a first driving signal generated by the first driving chip is loaded onto one or more of the first LED chips through the first signal input terminal;
a second LED light board, on which a second signal input terminal is disposed, wherein the second LED light board has a first end near to the second signal input terminal, and the second LED light board has a second end away from the second signal input terminal,
the second LED light board further includes a second flexible circuit board, a second substrate, a plurality of second LED chips, and a second driving chip,
the plurality of second LED chips are disposed on the second substrate,
the second flexible circuit board is electrically connected to the second signal input terminal and the second driving chip, the second driving chip is electrically connected to the second signal input terminal through the second flexible circuit board, and a second driving signal generated by the second driving chip is loaded onto one or more of the second LED chips through the second signal input terminal; and
a third LED light board, on which a third signal input terminal is disposed, wherein the third LED light board has a first end near the third signal input terminal, and the third LED light board has a second end away from the third signal input terminal,
the third LED light board further includes a third flexible circuit board, a third substrate, a plurality of third LED chips, and a third driving chip,
the plurality of third LED chips are disposed on the third substrate,
the third flexible circuit board is electrically connected to the third signal input terminal and the third driving chip, the third driving chip is electrically connected to the third signal input terminal through the third flexible circuit board, and a third driving signal generated by the third driving chip is loaded onto one or more of the third LED chips through the third signal input terminal;
wherein the first end of the first LED light board connects the first end of the second LED light board, and the second end of the first LED light board connects the second end of the third LED light board,
the first driving chip, the second driving chip, and the third driving chip are power source driving chips, and
the first driving signal, the second driving signal, and the third driving signal are voltage signals.

9. The display device according to claim 8, wherein a first splicing seam is between the first LED light board and the second LED light board, the first flexible circuit board and the second flexible circuit board are folded to a back surface of the splicing type light board away from a light emitting surface through the first splicing seam.

10. The display device according to claim 8, wherein the first LED light board connects the second LED light board in a horizontal plane to form a first splicing seam, a plurality of LED chips in an array arrangement are disposed on each of the first LED light board and the second LED light board, a distance between two adjacent rows of the LED chips on the first LED light board is same as a distance between two adjacent rows of the LED chips on the second LED light board.

11. The display device according to claim 8, wherein the first LED light board connects the second LED light board in a horizontal plane to form a first splicing seam, a plurality of LED chips in an array arrangement are disposed on each of the first LED light board and the second LED light board, a distance between a row of the LED chips on the first LED light board adjacent to the first splicing seam and a row of the LED chips on the second LED light board adjacent to the first splicing seam is equal to a distance between two adjacent rows of the LED chips on the first LED light board and/or a distance between two adjacent rows of the LED chips on the second LED light board.

12. The display device according to claim 8, wherein the first LED light board connects the third LED light board in a horizontal plane to form a second splicing seam, a plurality of LED chips in an array arrangement are disposed on each of the first LED light board and the third LED light board, a distance between a row of the LED chips on the first LED light board adjacent to the second splicing seam and a row of the LED chips on the third LED light board adjacent to the second splicing seam is equal to a distance between two adjacent rows of the LED chips on the first LED light board.

13. The display device according to claim 8, wherein the first LED light board connects the third LED light board in a horizontal plane to form a second splicing seam, wherein a plurality of LED chips in an array arrangement are disposed on each of the first LED light board and the third LED light board, a distance between a row of the LED chips on the first LED light board adjacent to the second splicing seam and a row of the LED chips on the third LED light board adjacent to the second splicing seam is equal to a distance between two adjacent rows of the LED chips on the third LED light board.

14. The display device according to claim 8, wherein the first signal input terminal is disposed on an end surface of the first end of the first LED light board or a back surface of the first LED light board away from a light emitting surface of the first LED light board.

15. The display device according to claim 8, wherein the second signal input terminal is disposed on an end surface of the first end of the second LED light board or the back surface of the second LED light board away from the light emitting surface of the second LED light board.

* * * * *